United States Patent
Pallerla et al.

(10) Patent No.: US 9,514,805 B1
(45) Date of Patent: Dec. 6, 2016

(54) INTELLIGENT BIT LINE PRECHARGE FOR IMPROVED DYNAMIC POWER

(71) Applicant: QUALCOMM Incorporated, San Diego, CA (US)

(72) Inventors: Arun Babu Pallerla, San Diego, CA (US); Ritu Chaba, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/083,055

(22) Filed: Mar. 28, 2016

(51) Int. Cl.
*G11C 11/00* (2006.01)
*G11C 11/419* (2006.01)

(52) U.S. Cl.
CPC .................................. *G11C 11/419* (2013.01)

(58) Field of Classification Search
None
See application file for complete search history.

(56) References Cited

U.S. PATENT DOCUMENTS

| | | |
|---|---|---|
| 5,199,002 A | 3/1993 | Ang et al. |
| 5,600,601 A | 2/1997 | Murakami et al. |
| 5,754,487 A | 5/1998 | Kim et al. |
| 8,243,541 B2 | 8/2012 | Cho et al. |
| 8,488,401 B2 | 7/2013 | Sasaki et al. |

*Primary Examiner* — Kretelia Graham
(74) *Attorney, Agent, or Firm* — Haynes and Boone, LLP

(57) ABSTRACT

A method and apparatus for writing data to a memory device are provided that do not change the precharge states for a bit line pair in a current write cycle if the current data bit is unchanged from the preceding write cycle.

10 Claims, 6 Drawing Sheets

INTELLIGENT BIT LINE PRECHARGE FOR IMPROVED DYNAMIC POWER

TECHNICAL FIELD

This application relates to memories, and more particularly to an intelligent bit line precharge for improved dynamic power.

BACKGROUND

Consumers demand that their mobile devices have sufficient battery life. But the clocking rate and throughput for mobile device processors continues to grow as well, which exacerbates the power demands on battery life. To provide sufficient battery life in light of these demands, additional power savings must be obtained from the various mobile device components.

A significant factor for mobile device battery life is the power consumption from the mobile device's embedded memories. Embedded memories occupy a relatively large amount of die space in a mobile device integrated circuit such as a system-on-a-chip (SOC). The resulting dynamic power for embedded memories may be a substantial portion of the overall power consumption of a given device. For example, it is conventional to precharge both bit lines in a corresponding bit line pair for each write cycle in an embedded static random access memory (SRAM). One of the bit lines in the bit line pair is then discharged responsive to the binary value to be written to a bitcell coupled to the bit line pair in the write cycle. The precharging and subsequent discharging of the bit lines contributes significantly to the embedded SRAM's dynamic power consumption.

There is thus a need in the art for improved SRAM architectures that provide reduced dynamic power consumption.

SUMMARY

A write driver is provided that "intelligently" precharges the bit lines in a bit line pair. The resulting precharge of the bit lines for a current write cycle is deemed to be intelligent because it depends upon the previous binary value written to a bit cell through the bit line pair in a preceding write cycle. If the current binary value to be written to a bit cell through the bit line pair in the current write cycle equals the previous binary value, the write driver leaves the precharged state of the bit line pair unchanged from the previous write cycle in the current write cycle. This is quite advantageous compared to a conventional precharge cycle in which both bit lines in the bit line pair would be precharged in the current write cycle such that one of the bit lines must then be needlessly discharged to ground after being precharged. The identity of the discharged bit line depends upon the binary value being written to the corresponding bit cell in the current write cycle. In contrast, the intelligent precharge disclosed herein does not waste charge by precharging the bit line that must be discharged in a current write cycle if this same bit line was discharged in the previous write cycle.

For each write cycle, the write driver drives the bit lines into a precharged state. For example, if a binary one is being written to a bit cell coupled to the bit line pair, the write driver charges the true bit line in the bit line pair to a power supply voltage while discharging the remaining complement bit line in the bit line pair. The precharge state for each bit line may thus be represented by a binary value: e.g., if the true bit line is charged to the power supply voltage, its precharge state may be deemed to be a binary one whereas if the true bit line were discharged its precharge state may be deemed to a binary zero—note that it is arbitrary what binary value is assigned to what precharge state. Regardless of the convention used to represent the precharge state (logic high or logic low), the precharge state for the true bit line and the precharge state for the complement bit line will always be complementary during normal operation of the write driver. In other words, if the precharge state for one of the bit lines in the bit line pair is a binary zero, the precharge state for the remaining bit line in the bit line pair will be a binary one. In a write cycle with intelligent precharge, the precharge states for a bit line pair for a preceding write cycle are not changed in a current write cycle during normal operation if the current data bit being written in the current write cycle has not changed with regard to the previous data bit written in the preceding write cycle through the same bit line pair.

With regard to the write cycles, note that a memory clock signal may trigger the discharging in a given write cycle. This triggering may be responsive to a binary high value of the memory clock signal or a binary low value of the memory clock signal. The following discussion will assume that the triggering of each write cycle discharge is responsive to a binary high value of the memory clock signal without loss of generality. In each memory clock cycle, the data bit being written has a corresponding binary value. The write driver uses the binary value of the data bit to control the precharge state for the bit line pair. In that regard, the write driver include a first transistor switch that couples between a power supply node supplying the power supply voltage and the true bit line. A complement current data bit controls the first transistor switch such that the first transistor switch is configured to close responsive to the complement current data bit being false (a binary zero in a logic high embodiment). A second transistor switch couples between the true bit line and ground that is controlled to close responsive to both the complement current data bit being true (a binary one in a logic high embodiment) and a complement memory clock signal being asserted low.

The true bit line would thus be discharged in a previous write cycle if the previous data bit had a logic low or zero binary value. If the current data bit is also a binary zero, there is no precharging of the true bit line in the current write cycle. In other words, if the previous precharge state for the true bit line was a logic zero and the current bit is a logic zero, the true bit line remains discharged in both the previous write cycle and the current write cycle. This is quite advantageous with regard to saving power as (assuming the data stream is perfectly random), there is a 50% probability in any given write cycle that the current data bit equals the previous data bit. An analogous pair of switches controls the precharge state of the complement bit line so that it does not change its precharge state if the current data bit equals the previous data bit.

BRIEF DESCRIPTION OF THE DRAWINGS

Embodiments of the disclosure and their advantages are best understood by referring to the detailed description that follows. It should be appreciated that like reference numerals are used to identify like elements illustrated in one or more of the figures.

DETAILED DESCRIPTION

To provide reduced dynamic power consumption, a write driver for a static random access memory (SRAM) is configured to change a precharge state for each bit line in a bit line pair for a current write cycle only when a current data bit being written in a current write cycle is a complement of a previously-written data bit in the preceding write cycle. For example, suppose the previously-written data bit was a binary zero. To write such a binary value into a bit cell in the previous write cycle, the write driver discharged the true bit line in a bit line pair coupled to the bit cell while charging a remaining complement bit line in the bit line pair to a power supply voltage VDD. The precharge state for the true bit line in the previous write cycle was thus a binary zero whereas the precharge state for the complement bit line was a binary one in such a previous write cycle. If the current data bit to be written by the write driver through the same bit line pair is also a binary zero, the precharge state for the bit line pair is left unchanged in the current write cycle. Conversely, if the current data bit is a complement of the previously-written data bit, the write driver changes the precharge states for the bit line pair. Similarly, if the previously-written data bit was a binary one, the precharge state for the true bit line in the previous write cycle was a binary one whereas the precharge state for the complement bit line was a binary zero. If the current data bit and the previously-written data bit are both a binary one, the write driver does not change the precharge states for the bit line pair in the current write cycle.

The following discussion is directed to a dual-port (separate read port and write port for each bit cell) embodiment. But it will be appreciated that single-port embodiments may also enjoy the power savings from the selective bit line precharging discussed herein. In addition, the following discussion is directed to an SRAM with word masking. For example, a word line may be divided into multiple bytes. The various bytes may be masked or unmasked depending upon whether a write operation to them is desired or not. However, it will be appreciated that the selective bit line precharging cycles discussed herein may also be implemented in SRAMs that do not employ word masking.

Figure 1:
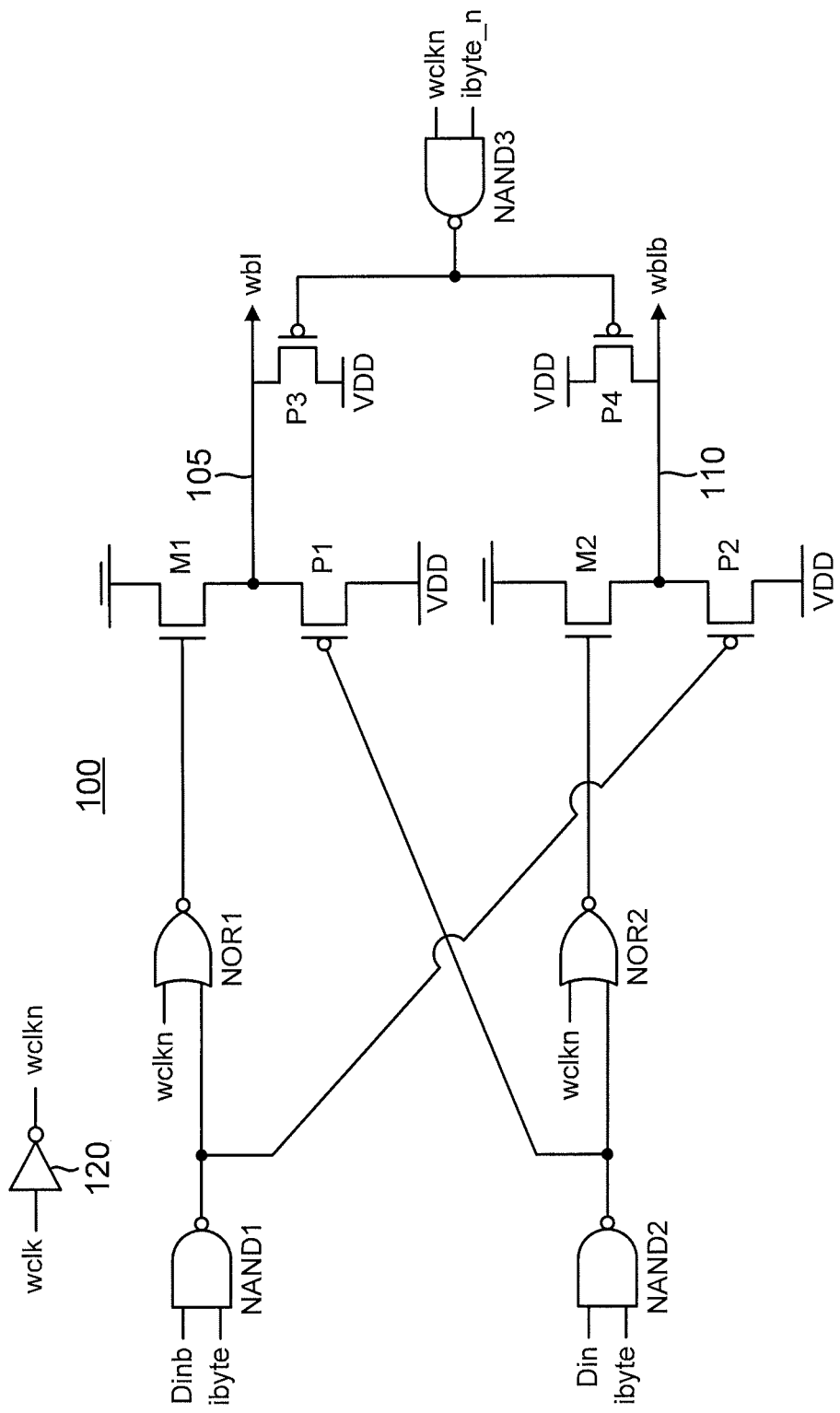
FIG. 1 is a circuit diagram of an intelligent precharge write driver in accordance with an aspect of the disclosure.

An example write driver 100 is shown in FIG. 1. Write driver 100 controls the precharge states for a true write bit line 105 (wbl) and a complement write bit line 110 (wblb) during each write cycle. A memory clock signal (wclk) controls the timing of each write cycle by write driver 100. For brevity, true write bit line 105 will be referred to as a true bit line 105 in the following discussion. Similarly, complement write bit line 110 will be denoted as a complement bit line 110. True bit line 105 couples to a power supply node supplying a power supply voltage VDD through a first transistor switch such as a PMOS transistor P1. A first logic gate such as a NAND gate NAND2 controls the on and off states of PMOS transistor P1 by driving its gate voltage. NAND gate NAND2 performs a logical NAND of an active-low data masking command ibyte with the current data bit (Din). Should the data masking command ibyte be de-asserted (charged to the power supply voltage VDD since it is an active-low signal), NAND gate NAND2 functions as an inverter to invert the current data bit Din into a complement current data bit (Dinb). Should the current data bit Din be a binary one, NAND gate NAND2 would thus drive the gate of PMOS transistor P1 with a binary zero to switch PMOS transistor P1 on to precharge true bit line 105 to the power supply voltage VDD for the duration of the current write cycle as determined by the period for the memory clock signal wclk.

True bit line 105 also couples to ground through a second transistor switch such as an NMOS transistor M1. A second logic gate such as a NOR gate NOR1 controls the on and off states of NMOS transistor M1. NOR gate NOR1 receives the output of a third logic gate such as a NAND gate NAND1, which performs a logical NAND of the complement current data bit Dinb and the data masking command ibyte. If the data masking command ibyte is de-asserted (charged high since it is an active-low signal), NAND gate NAND 1 acts as an inverter such that the output of NAND gate NAND1 will thus equal the current data bit Din. NOR gate NOR1 then forms a logical NOR of the current data bit Din and a complement memory clock signal (wclkn) as produced by an inverter 120. When the memory clock signal wclk is driven high and the data masking command ibyte is de-asserted high, NOR gate NOR1 thus acts as an inverter to invert the current data bit Din from NAND gate NAND1 into the complement current data bit Dinb to control the gate voltage of transistor M1. Transistor M1 will thus switch on for one-half of the current memory clock cycle in which the complement memory clock signal wclkn is discharged to discharge true bit line 105 when the current data bit Din is a binary zero. During the remaining one-half of the current memory clock cycle, transistor M1 is turned off so that true bit line 105 floats. But this floating involves no precharging of true bit line 105. For example, if the current data bit Din for a first write cycle (and thus a first cycle of the memory clock wclk) equals a binary zero, NOR gate NOR1 will discharge true bit line 105 by switching on transistor M1 during the half memory clock cycle in which memory clock signal wclk is driven to a binary high value. If the current data bit Din for a following second write cycle (and thus a second cycle of the memory clock wclk) is also a binary zero, NOR gate NOR1 will maintain the discharge of true bit line 105 by switching on transistor M1 during the half memory clock cycle in which the memory clock signal wclk is driven to a binary high value. Although true bit line 105 floats during the half cycle of the current memory clock cycle in which memory clock signal wclk is a binary zero, this floating is at ground such that there is no precharging. In contrast, a conventional write driver would precharge true bit line 105 and then discharge it to write the same binary zero value, which wastes power. Accordingly, write driver 100 advantageously reduces dynamic power consumption. Should the current data bit Din for two consecutive write cycles equal a binary one, true bit line 105 remains charged to the power supply voltage VDD for the duration of both corresponding memory clock cycles.

The control of the precharge state for complement write bit line 110 is analogous in that it couples to the power supply node through a third transistor switch such as a PMOS transistor P2 and couples to ground through a fourth transistor switch such as an NMOS transistor M2. NAND gate NAND1 controls the on and off states of transistor P2. As discussed earlier, NAND gate NAND1 performs a logical NAND of the data masking command ibyte and the complement current data bit Dinb. Thus, during a no mask condition in which the data masking command ibyte (which may also be denoted as a data masking signal ibyte) is de-asserted to the power supply voltage VDD, NAND gate NAND1 acts as an inverter to invert the complement current data bit Dinb into the current data bit Din. If the current data bit Din is a binary zero, NAND gate NAND1 then drives the gate of transistor P2 with a binary zero to switch transistor P2 on to precharge complement bit line 110 to the power supply voltage VDD. Conversely, if the current data bit Din is a binary one, NAND gate NAND1 switches transistor P2 off.

A fourth logic gate such as a NOR gate NOR2 controls the on and off states of transistor M2. NOR gate NOR2 is configured to NOR the output of NAND gate NAND2 with the complement memory clock signal wclkn. The output of NAND gate NAND2 during an unmasked write cycle is the complement current data bit Dinb as discussed above. When the memory clock wclk is asserted to a binary one, NOR gate NOR2 thus acts as an inverter to invert the complement current data bit Dinb back into the current data bit Din. NOR gate NOR2 will thus switch on transistor M2 to ground complement bit line 110 when the current data bit Din is a binary one, the memory clock signal wclk is asserted high, and the data masking signal ibyte is a binary one. NOR gate NOR2 switches off transistor M2 when the memory clock signal wclk is pulled low, causing complement bit line 110 to float. Should the current data bit Din be a binary one across two consecutive write cycles, complement bit line 110 is not precharged but remains grounded. The precharge states for true bit line 105 and complement bit line 110 thus does not change across two consecutive write cycles (corresponding to two consecutive cycles of memory clock signal wclk) so long as the current data bit Din does not change states across the two consecutive write cycles.

If the data masking signal ibyte is asserted low, true bit line 105 and complement bit line 110 are both precharged to the power supply voltage VDD. For example, a fifth logic gate such as a NAND gate NAND3 may be configured to NAND the complement memory clock signal wclkn with a complement data masking signal (ibyte_n). Since the data masking signal ibyte is active low, the complement data masking signal ibyte_n is active high. NAND gate NAND3 will thus receive two binary one inputs when the memory clock signal wclkn is asserted high while the data masking signal ibyte is asserted low. The output from NAND gate NAND3 couples to a gate of a PMOS transistor P3 that couples between true bit line 105 and the power supply node. Similarly, the output from NAND gate NAND3 couples to a gate of a PMOS transistor P4 that couples between complement bit line 110 and the power supply node. Both transistors P3 and P4 will thus be switched on to precharge their corresponding bit lines to the power supply voltage VDD in response to the complement data masking signal ibyte_n and the complement memory clock signal wclkn both equaling a binary one value. In one embodiment, write driver 100 may be deemed to comprise a means for driving a true bit line in a bit line pair into a precharge state and for driving a complement bit line in the bit line pair into a precharge state to write a current data bit into a bit cell through the bit line pair in a current write cycle, wherein the means is further configured to not change the precharge state for the true bit line and the complement bit line responsive to the current data bit equaling a previous data bit written through the bit line pair in a preceding write cycle. An example memory incorporating a plurality of write drivers 100 will now be discussed.

Figure 2:
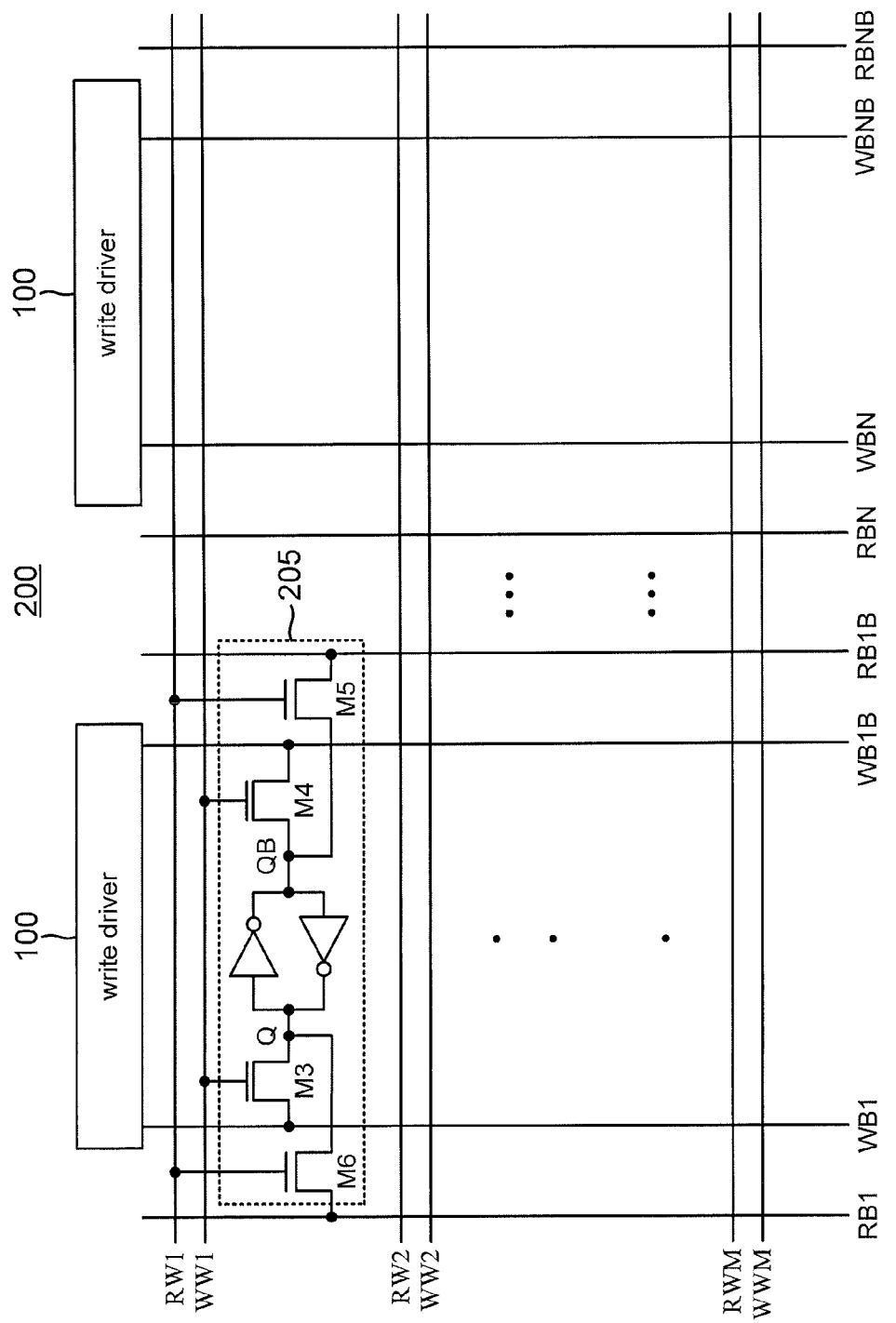
FIG. 2 is a memory including a plurality of intelligent precharge write drivers in accordance with an aspect of the disclosure.

A plurality of write drivers 100 may be incorporated into an example SRAM 200 as shown in FIG. 2. SRAM 200 includes a plurality of write bit line pairs ranging from a first write bit line pair formed by a true write bit line WB1 and a complement write bit line WB1B to an nth write bit line pair formed by a true write bit line WBN and a complement write bit line WBNB. Each write bit line pair also corresponds to a read bit line pair since SRAM 200 is a dual-port SRAM. The read bit line pairs thus range from a first read bit line pair formed by a true read bit line RB1 and a complement read bit line RB1B to a nth read bit line pair formed by a true read bit line RBN and a complement read bit line RBNB. SRAM 200 includes a plurality of bit cells. For illustration clarity, only a first bit cell 205 is shown in FIG. 2. The bit cells are arranged in columns, with each column including a corresponding read bit line and write bit line pair. For example, a first column corresponds to the first read bit line pair of RB1 and RB1B and the first write bit line pair of WB1 and WB1B. The write bit line pair in each column is driven by a corresponding write driver 100.

The bit cells are also arranged in rows, with each row having its own read word line and write word line. SRAM 200 includes a plurality of m rows ranging from a first row corresponding to a first read word line RW1 and a first write word line WW1 to an mth row corresponding to an mth read word line RWM and an mth write word line WWM. Each bit cell is disposed at an intersection of a corresponding row and column. For example, first bit cell 205 is disposed at the intersection of the first row and the first column. Since there are n columns and m rows, there is a total of (n*m) bit cells in SRAM 200. Each bit cell includes a pair of cross-coupled inverters for latching the corresponding bit driven by the corresponding write driver 100. As shown for first bit cell 205, an access transistor M6 has its gate driven by the read word line RW1 to couple a latched bit Q node in bit cell 205 to the true read bit line RB1. Similarly, read word line RW1 couples to the gate of an access transistor M5 to couple a complement latched bit QB node to the complement read bit line RB1B. An analogous pair of access transistors M3 and M4 couple the Q and QB nodes to the true write bit line WB1 and complement write bit line WB1B, respectively, in response to an assertion of the first write word line WW1.

Figure 3:
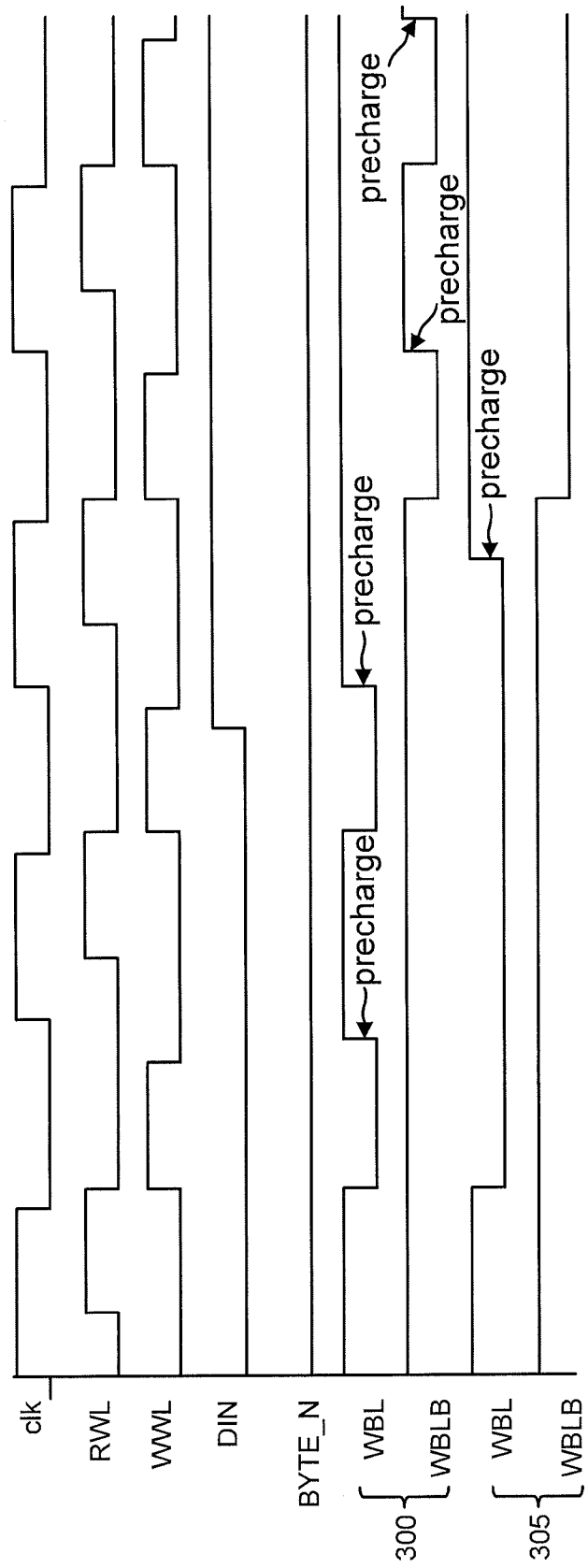
FIG. 3 illustrates a plurality of waveforms including the bit line voltage waveforms for the memory of FIG. 2 and also the bit line voltage waveforms for a conventional memory during a plurality of read and write cycles in which there is no data masking.

Some signal waveforms for SRAM 200 are shown in FIG. 3 for a plurality of read and write cycles. Each cycle of a memory clock signal (elk) triggers both a read cycle and a write cycle. In each memory clock signal cycle, the read word line voltage (RWL) is asserted first to trigger a read cycle. An assertion of the write word line voltage (WWL) follows to trigger a write cycle. For the first two cycles of the memory clock signal, the current data bit (Din) is a binary zero. The complement masking command byte_n is asserted low for all cycles of the memory clock signal in FIG. 3. To better illustrate the advantageous properties of write driver 100, FIG. 3 also includes the bit line pair voltages 300 for a conventional write driver as compared to the intelligent bit line pair voltages 305. In conventional bit line pair voltages 300, the true bit line WBL is precharged and discharged for the first two memory clock cycles in which the current data bit Din is a binary zero. But note that there is only one discharge of the true bit line WBL in intelligent bit line pair voltages 305. This discharge puts the true bit line WBL into the desired binary zero state since the current data bit for the initial two memory clock cycles is a binary zero. There is no precharge of the true bit line WBL in intelligent bit line pair voltages 305 for the second memory clock cycle since the current data bit has not changed states.

Conversely, the current data bit Din is driven to a binary high value for the final two memory clock cycles of FIG. 3. Thus, the complement bit line WBLB in conventional bit line pair voltages 300 is precharged and discharged in both of these final two memory clock cycles. In contrast, the complement bit line WBLB in intelligent bit line pair voltages 305 is discharged only once in both of the final two memory clock cycles. The implementation of intelligent bit line pair voltages 305 thus has just one-half the dynamic power consumption as compared to the implementation of conventional bit line pair voltages 300.

Figure 4:
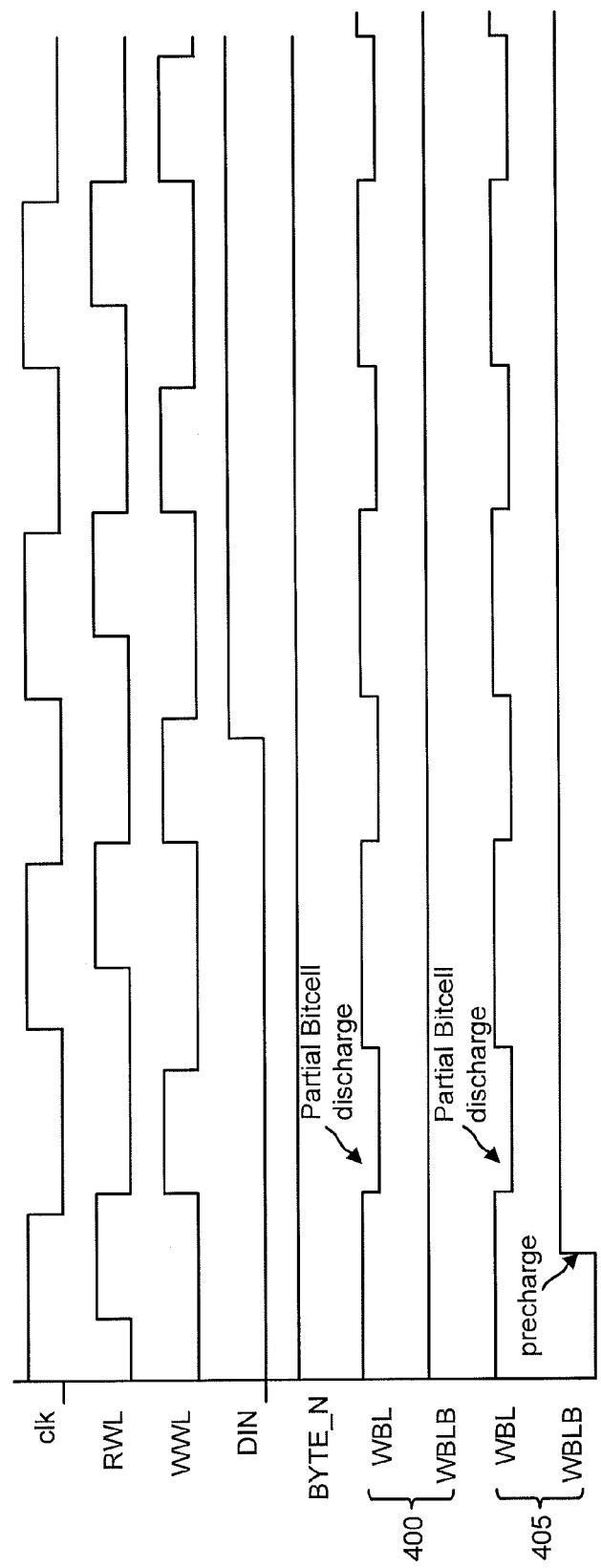
FIG. 4 illustrates a plurality of waveforms including the bit line voltage waveforms for the memory of FIG. 2 and also the bit line voltage waveforms for a conventional memory during a plurality of read and write cycles in which there is data masking.

The same waveforms from FIG. 3 are shown in FIG. 4 except that the complement data masking signal byte_n is asserted. The bit line pair voltages 400 for a conventional write driver are similar to the intelligent bit line pair voltages 405 except that the complement bit line WBLB is not precharged in intelligent bit line pair voltages 405 until the second half of the initial memory clock cycle. Although the data masking is active, a partial read cycle occurs in the affected bit cell such that the true bit line voltage (assuming that the affected bit cell is storing a binary zero) droops for each assertion of the write word line WWL.

Figure 5:
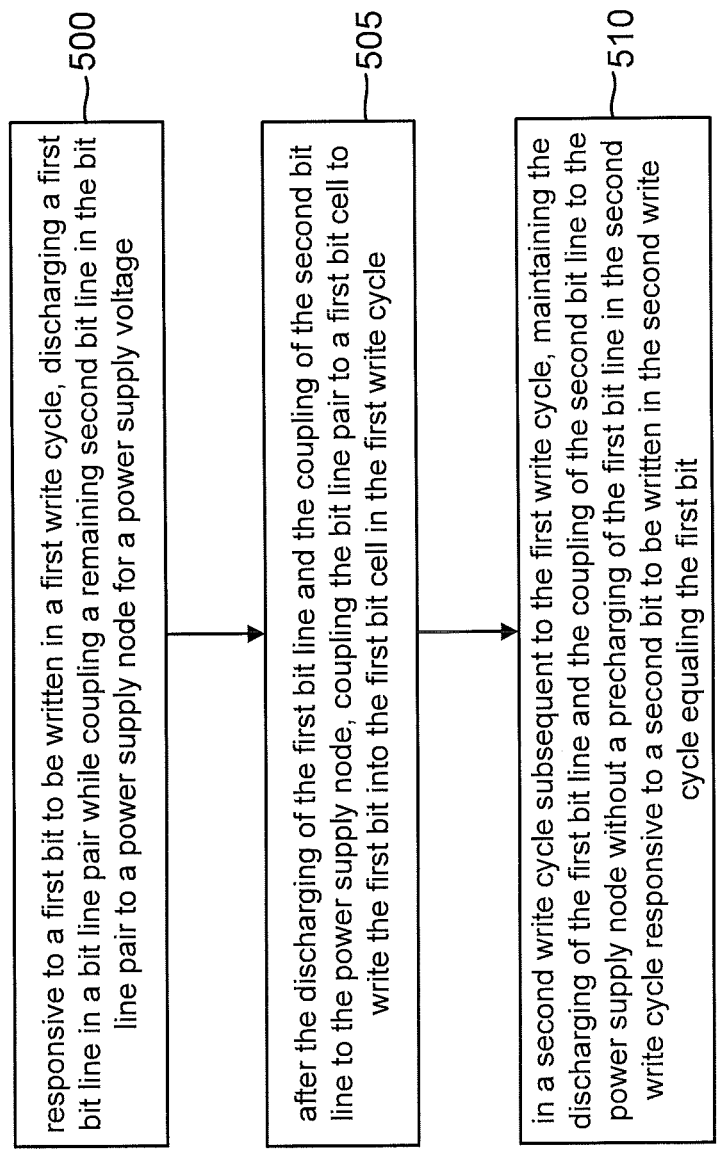
FIG. 5 is a flowchart for a method of cycle for an intelligent write driver in accordance with an aspect of the disclosure.

An example method of cycle for write driver 100 will now be discussed with regard to the flowchart of FIG. 5. The method begins with an act 500 of, responsive to a first bit to be written in a first write cycle, discharging a first bit line in a bit line pair while coupling a remaining bit line in the bit line pair to a power supply node supplying a power supply voltage. An example of act 500 is the discharge of true bit line 105 and charging of complement bit line 110 discussed with regard to FIG. 1 in preparation for writing a binary zero bit to a bit cell coupled to the bit line pair.

The method further includes an act 505 of, after the discharging of the first bit line and the coupling of the second bit line to the power supply node, coupling the bit line pair to a first bit cell to write the first bit into the first bit cell in the first write cycle. An assertion of the first write word line WW1 of FIG. 2 to couple bit cell 205 to the first write bit line pair formed by bit lines WB1 and WB1B (with bit line WB1 discharged and WB1B charged) is an example of act 505.

Finally, the method includes an act 510 of, in a second write cycle subsequent to the first write cycle, maintaining the discharging of the first bit line and the coupling of the second bit line to the power supply node without a precharging of the first bit line in the second write cycle responsive to a second bit to be written in the second write cycle equaling the first bit. The maintaining of the precharge states for true bit line 105 and complement bit line 110 in a current write cycle responsive to the current data bit not changing from the previously-written data bit in the preceding write cycle as discussed with regard to FIG. 1 is an example of act 510.

Figure 6:
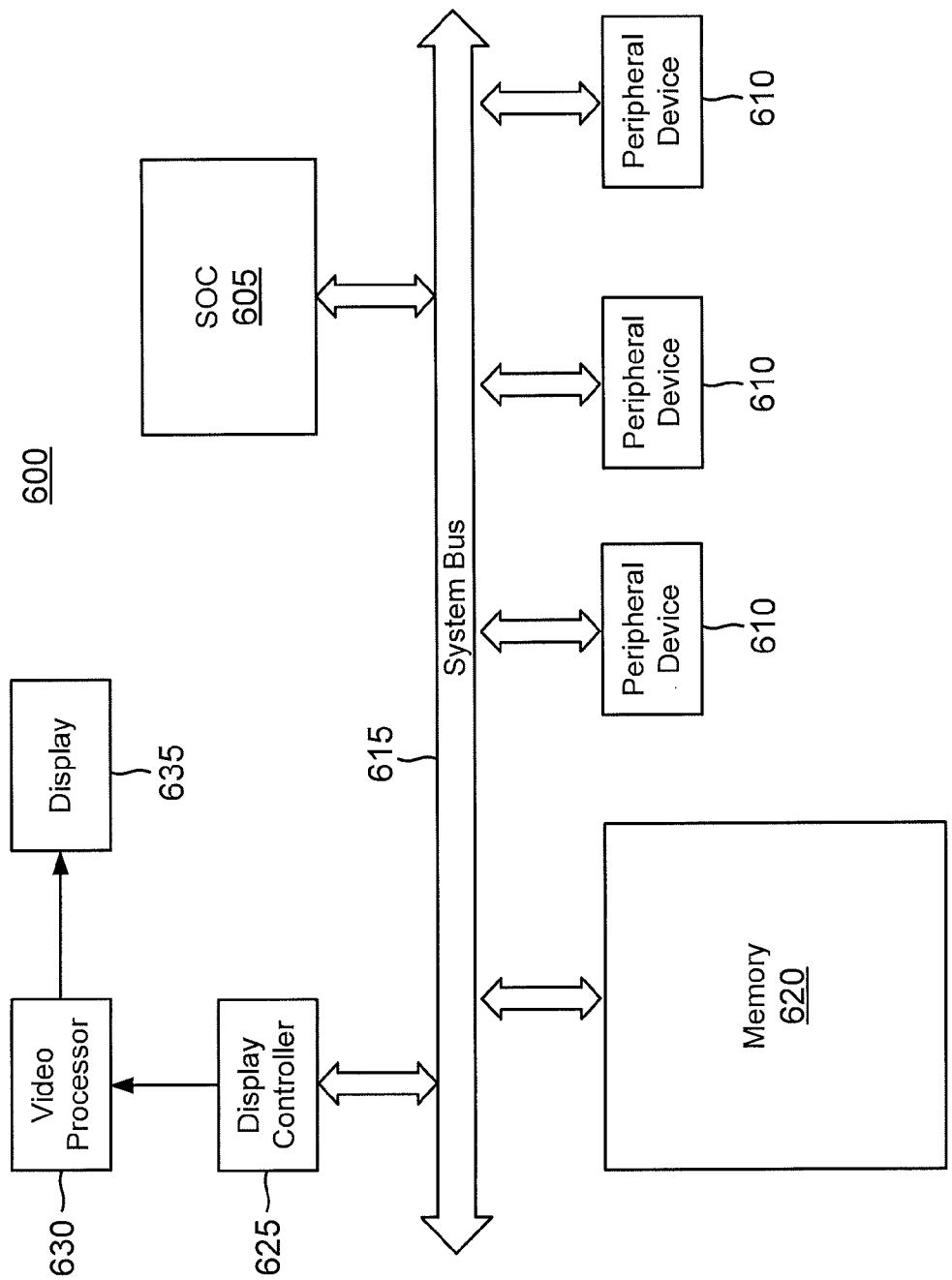
FIG. 6 is a block diagram of an example mobile device incorporating a system-on-a-chip having the embedded memory of FIG. 2.

SRAM 200 of FIG. 2 may be incorporated into an integrated circuit such as a system-on-a-chip (SOC) 605 that in turn is incorporated into a mobile device 600 such as shown in FIG. 6. Mobile device 600 may comprise a cellular phone, smart phone, personal digital assistant, tablet computer, laptop computer, digital camera, handheld gaming device, or other suitable device. SOC 605 communicates with peripheral devices 610 such as sensors over a system bus 615 that also couples to a memory such as a DRAM 620 and to a display controller 625. In turn display controller 625 couples to a video processor 630 that drives a display 635.

Those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A write driver for writing a current data bit through a bit line pair, comprising;
   a true bit line in the bit line pair;
   a first transistor switch coupled between the true bit line and a power supply node;
   a first logic gate configured to switch the first transistor switch on responsive to the current data bit being true and to switch the first transistor switch off responsive to the current data bit being false;
   a second transistor switch coupled between the true bit line and ground; and
   a second logic gate configured to switch the second transistor switch on responsive to both the current data bit being false and an assertion of a memory clock signal and to switch the second transistor switch off responsive to current data bit being true or a de-assertion of the memory clock signal.

2. The write driver of claim 1, wherein the first transistor switch comprises a PMOS transistor, and wherein the first logic gate comprises a NAND gate having an output coupled to a gate of the PMOS transistor, and wherein the NAND gate is configured to NAND the current data bit with an active-low data masking signal.

3. The write driver of claim 2, wherein the second transistor switch comprises an NMOS transistor, and wherein the second logic gate comprises a NOR gate having an output coupled to a gate of the NMOS transistor, and wherein the NOR gate is configured to NOR the current data bit with a complement of the memory clock signal.

4. The write driver of claim 1, further comprising:
   a complement bit line in the bit line pair;
   a third transistor switch coupled between the complement bit line and a power supply node;
   a third logic gate configured to switch the third transistor switch on responsive to a complement of the current data bit being true and to switch the third transistor switch off responsive to the complement of the current data bit being false;
   a fourth transistor switch coupled between the complement bit line and ground; and
   a fourth logic gate configured to switch the fourth transistor switch on responsive to both the complement of the current data bit being false and an assertion of a memory clock signal and to switch the fourth transistor switch off responsive to complement of the current data bit being true or a de-assertion of the memory clock signal.

5. The write driver of claim 4, wherein the third transistor switch comprises a PMOS transistor, and wherein the third logic gate comprises a NAND gate having an output coupled to a gate of the PMOS transistor, and wherein the NAND gate is configured to NAND a complement of the current data bit with an active-low data masking signal.

6. The write driver of claim 4, wherein the fourth transistor switch comprises an NMOS transistor, and wherein the fourth logic gate comprises a NOR gate having an output coupled to a gate of the NMOS transistor, and wherein the NOR gate is configured to NOR a complement of the current data bit with a complement of the memory clock signal.

7. The write driver of claim 5, further comprising:
- a fifth transistor switch coupled between the true bit line and the power supply node;
- a sixth transistor switch coupled between the complement bit line and ground; and
- a fifth logic gate configured to switch both the fifth transistor switch and the sixth transistor switch on responsive to a de-assertion of the memory clock signal and a de-assertion of the active-low data masking signal, wherein the fifth logic gate is further configured to switch both the first transistor switch and the sixth transistor switch off responsive to an assertion of either the memory clock signal or an assertion of the active-low data masking signal.

8. The write driver of claim 7, wherein the fifth transistor switch comprises a first PMOS transistor and the sixth transistor switch comprises a second PMOS transistor, and wherein the fifth logic gate comprises a NAND gate coupled to a gate of the first PMOS transistor and to a gate of the second PMOS transistor, and wherein the NAND gate is configured to NAND a complement of the memory clock signal with a complement of the active-low data masking signal.

9. The write driver of claim 4, wherein the write driver is incorporated into a static random access memory (SRAM), the SRAM including:
- a pair of cross-coupled inverters configured to form a bit cell;
- a first access transistor coupled between the true bit line and an input for a first inverter in the pair of cross-coupled inverters;
- a second access transistor coupled between the complement bit line and an input for a second inverter in the pair of cross-coupled inverters; and
- a write word line coupled to a gate for the first access transistor and to a gate for the second access transistor.

10. The SRAM of claim 9, wherein the SRAM is included within an integrated circuit, and wherein the integrated circuit is included in a device selected from the group consisting of a cellular phone, a smart phone, a personal digital assistant, a tablet computer, a laptop computer, a digital camera, and a handheld gaming device.

* * * * *